United States Patent [19]

Ni

[11] Patent Number: 5,166,617

[45] Date of Patent: Nov. 24, 1992

[54] HIGH POWER NMR PROBE

[75] Inventor: Xuan Z. Ni, Cupertino, Calif.

[73] Assignee: Varian Associates, Inc., Palo Alto, Calif.

[21] Appl. No.: 640,183

[22] Filed: Jan. 11, 1991

[51] Int. Cl.⁵ ............................................. G01R 33/20
[52] U.S. Cl. .................................... 324/318; 324/322
[58] Field of Search ............... 324/300, 307, 309, 313, 324/314, 318, 322; 128/653 SC

[56] References Cited

U.S. PATENT DOCUMENTS

| 4,710,719 | 12/1987 | Doty | 324/318 |
| 4,920,318 | 4/1990 | Misic et al. | 324/322 |
| 4,996,482 | 2/1991 | Fujito | 324/322 |

Primary Examiner—Louis Arana
Attorney, Agent, or Firm—Edward H. Berkowitz

[57] ABSTRACT

An NMR probe employs an adjustable RF voltage divider ($C_1$, $C_2'$) comprising a single capacitive impedance switched into or out of the divider by a single 2-pole switch (SP1', SP2').

4 Claims, 4 Drawing Sheets

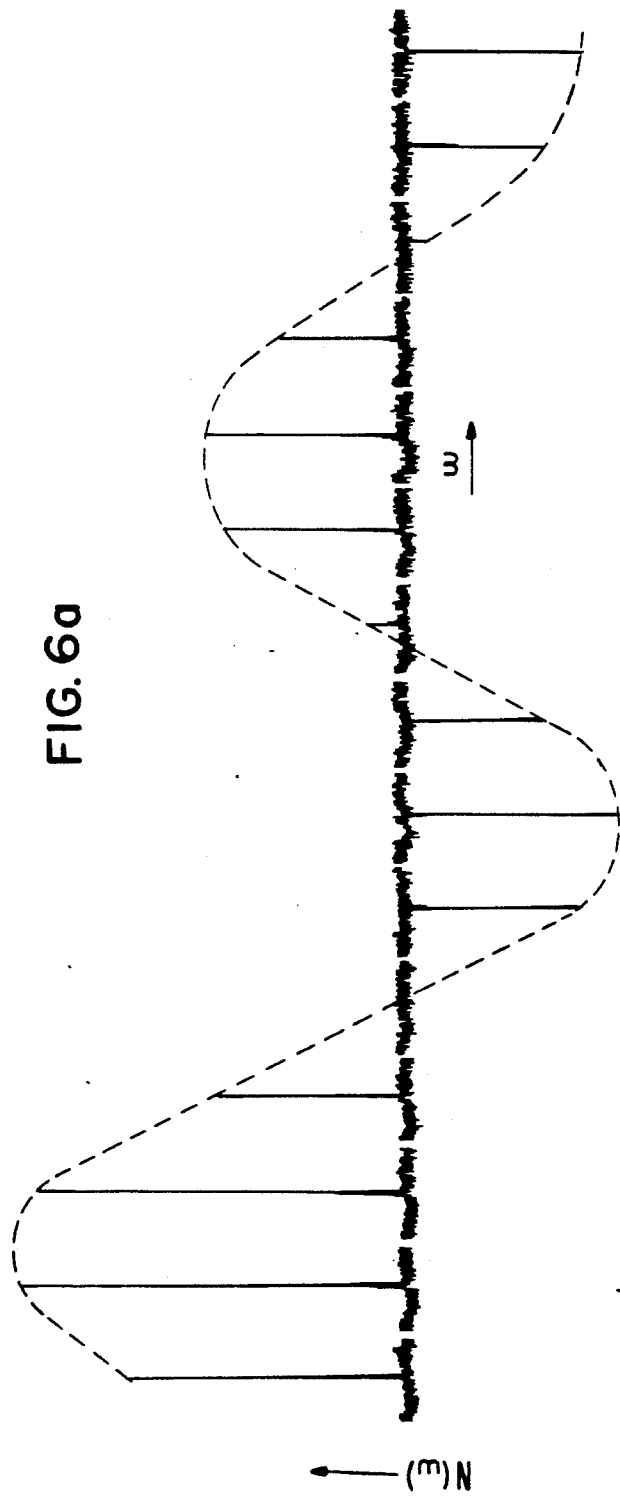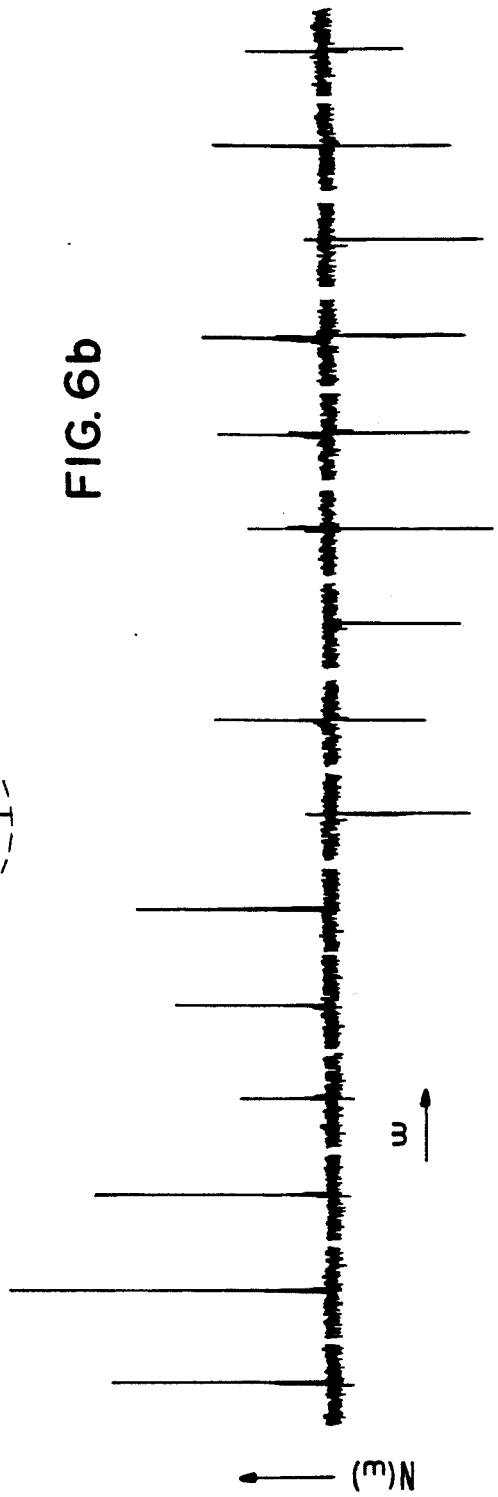

5,166,617

HIGH POWER NMR PROBE

FIELD OF THE INVENTION

The invention is in the field of tuned radio frequency circuits for use in coupling RF energy to a sample in nuclear magnetic resonance probes and is directed in particular to improving the multinuclear resonance capability of such probes.

BACKGROUND OF INVENTION

In order to study the magnetic resonance of nuclei which exhibit widely differing gyromagnetic ratios, it is necessary to provide a circuit for coupling the sample with the transmitter and receiver of the NMR apparatus, and this coupling circuit must be capable of being tuned over a correspondingly wide frequency range. In the case where the RF power dissipated in the sample is relatively high, the high RF voltages and currents experienced in the coupling circuit impose additional performance problems. Problems such as RF voltage breakdown, for example, are exacerbated by the need for compact design which is required by limited radial dimensions imposed by the magnet bore, magnetic field homogeneity characteristics, the need to accommodate a number of accessories and functions in or near the probe body such as apparatus to spin the sample at a desired angle, gradient coils to reduce spatial magnetic inhomogeneities or to impose same for spacial discrimination purposes, sample temperature control means and the like.

A prior art arrangement is known in which a voltage divider is incorporated into the resonance circuit for the purposes of limiting the voltages experienced by the components of a tune and match capacitor network and further incorporating a three pole switching means to select from pairs of capacitances forming an RF voltage divider from among a plurality of such pairs through a 3-pole switching means. This work is described in greater detail in U.S. Pat. No. 4,710,719.

BRIEF SUMMARY OF THE INVENTION

The present invention achieves RF coupling to a sample in a high power situation where it is necessary to provide an RF voltage divider to protect the tune and match network of a resonant LC circuit. In the present invention, the circuit is modified to maintain one capacitance of the RF divider fixed while the other capacitance of the divider may be selected with a two-pole switching arrangement to achieve a relatively broad range of resonance conditions for the circuit.

BRIEF DESCRIPTION OF THE DRAWINGS

FIG. 6(a) and 6(b) are spectra of the identical sample comparing the present invention and the circuit of FIG. 5, respectively.

DETAILED DESCRIPTION OF THE INVENTION

Figure 1:
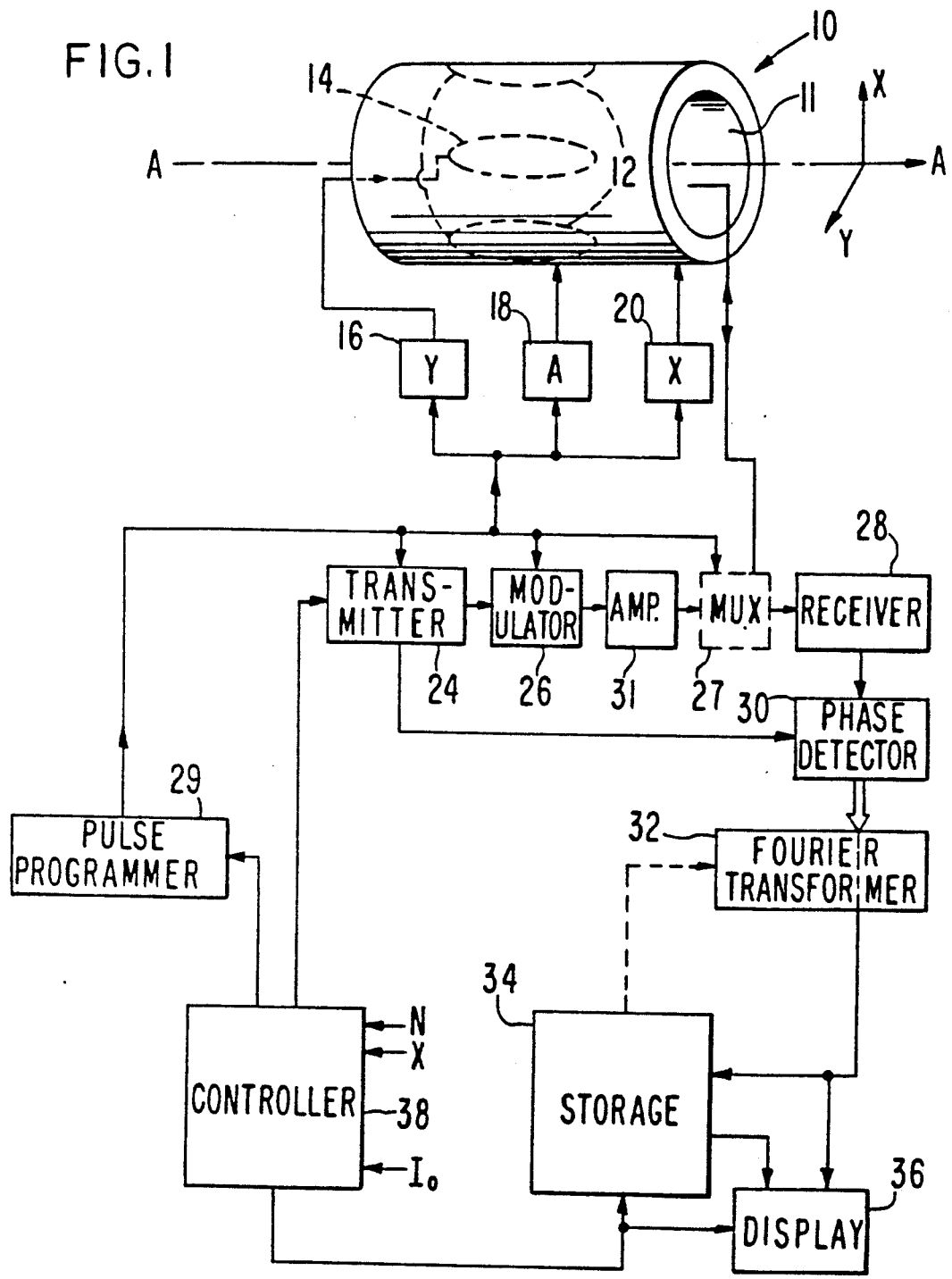
FIG. 1 illustrates the context of the invention.

At FIG. 1 there is shown an idealized NMR apparatus. A magnet 10 having bore 11 provides a main dc magnetic field. In order to control the magnetic field with required precision, there are provided magnetic field gradient coils 12 and 14 schematically represented. These and additional gradient coils (not shown) may be driven by gradient power supplies 16, 18 and 20 to function in a representative manner to compensate inhomogeneities of the magnetic field on a dc basis, or alternatively, to supply desired gradients on a pulsed basis for spatially discriminatory experiments. An object for analysis (hereafter "sample") is placed within the magnetic field in bore, and the sample is subject to irradiation by RF power, such that the RF magnetic field is aligned in a desired orthogonal relationship with the magnetic field in the interior of bore 11. This is accomplished through a probe circuit as further described which is located in the interior of bore 11 and not shown in FIG. 1. Resonant samples are induced in a receiver coil proximate the sample within bore 11 and also not shown.

As shown in FIG. 1, RF power is provided from transmitter 24, modulated by modulator 26 to yield amplitude modulated pulses of RF power which are amplified by amplifier 31 and then directed via multiplexer 27 to the RF transmitter coil of the probe (not shown) located within bore 11. Transmitter and receiver coils are clearly not concurrently active as such. The identical coil may be employed for both functions if so desired. Thus, a multiplexer 27 may be provided to isolate the receiver from the transmitter. In the case of separate transmitter and receiver coils, element 27, while not precisely a multiplexer, will perform a similar isolation function to control receiver operation.

The modulator 26 is controlled by pulse programmer 29 to provide all the pulses of desired amplitude, duration and phase relative to the RF carrier at preselected time intervals. The pulse programmer also controls the gradient power supplies 16, 18 and 20 if such gradients are employed on a pulsed basis. These gradient power supplies represent also the maintenance of selected static gradients in the respective gradient coils if so required.

The transient nuclear resonance wave form is processed by receiver 28 and further resolved in phase quadrature through phase detector 30. Phase resolved time delaying signals from phase detector 30 are presented to Fourier transformer 32 for transformation to the frequency domain in accordance with specific requirements of the processing of the acquired data. Conversion of the analog resonance signal to digital form is commonly carried out on the phase resolved signals through analog to digital converter (ADC) structures which may be regarded as a component of phase detector 30 for convenience.

It is understood that Fourier transformer 32 may in fact act upon a stored (in storage 34) representation of the phase resolved data. This reflects the common practice of averaging a number of time domain phase resolved wave forms to enhance the signal-to-noise ratio. The transformation function is then applied to the resultant average wave form. Display device 36 operates on the acquired data to present same for inspection. Controller 38 most often comprising one or more computers, controls and correlates the operation of the entire apparatus.

Figure 2:
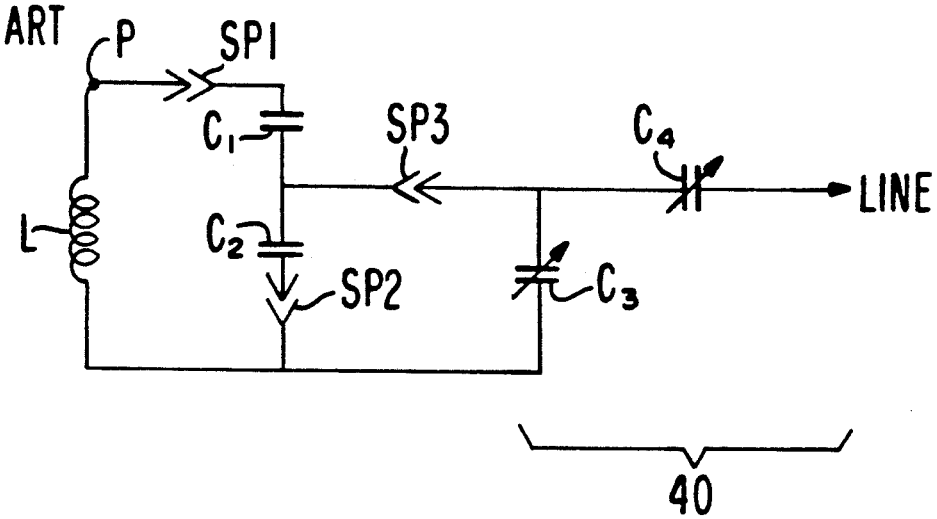
FIG. 2 is a probe circuit of prior art.

Turning now to FIG. 2, there is shown an arrangement suitable for use to achieve the requirements of the probe circuit for coupling the sample to a source of RF power. This circuit is characterized by inductance L which with capacitance $C_3$, forms a parallel resonant combination for some frequency within a range determined by the range of variable capacitance $C_3$. The capacitance $C_4$ matches the impedance of the probe to the transmission line, not shown. An RF voltage divider comprising the series combination ($C_1$, $C_2$) is inserted between the tune/match network 40 and the inductance L to reduce the RF voltage drop presented to the tune/match network 40. The ($C_1$, $C_2$) divider effects the response of the probe circuit. In particular, the range over which probe circuit is tunable is now reduced due to the presence of the capacitor $C_2$, and it is necessary to vary the capacitive divider to maintain the desired tuning range. The prior art introduced a switching arrangement wherein three poles, SP1, SP2, and SP3, comprise spring contacts mating with contacts on a tuning wand which was inserted or withdrawn to introduce different values for the combination ($C_1$, $C_2$).

Figure 3:
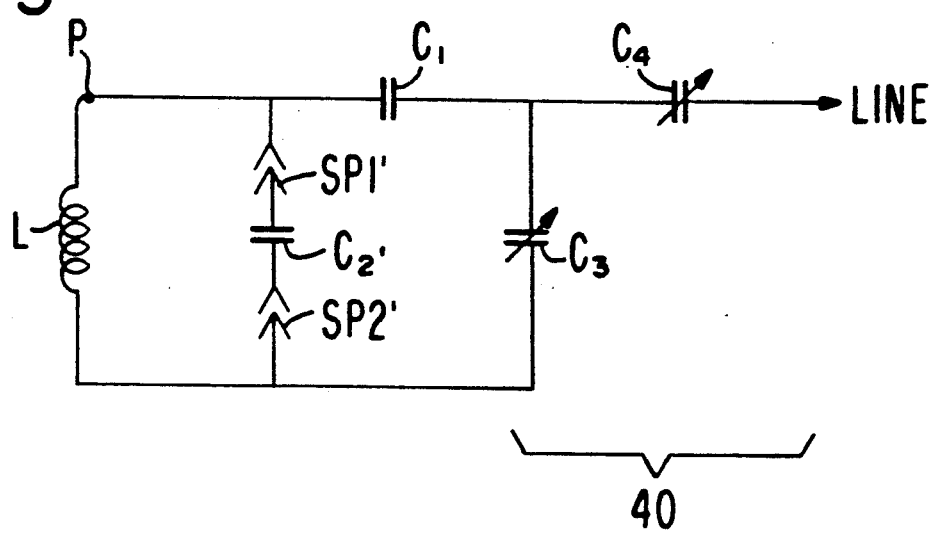
FIG. 3 shows the circuit of the present invention.

Turning now to FIG. 3, the present invention is illustrated in circuit form with similar notation for comparison with FIG. 2. The tune and match network 40 and inductance L are unaffected. The capacitor $C_1$ is also unaffected in its relationship between the inductance L and the tune/match network 40, and the capacitor $C_{2'}$ functions with $C_1$ as an RF voltage divider as before. However, the capacitance $C_{2'}$ is no longer in simple parallel combination with $C_3$ as in the prior art of FIG. 2. Consequently, for the same resonant condition with inductance L, the total parallel capacitance is now furnished for the most part by tuning capacitor $C_3$ with a much lower value required for capacitance $C_{2'}$ in order to accomplish the function of the voltage divider. If, for example, $C_{2'}$ is selected to be $\sim \frac{1}{2} C_2$, the tuning range of the circuit will be expanded by $\sim 2$ in comparison with the prior art. Given the same lower limit for the frequency range of operation, the circuit of the present invention implements $C_{2'}$ with a much smaller value of, capacitance than $C_2$ of prior art.

In the present invention, two pole switching is observed to be adequate to switch the capacitance $C_{2'}$ as may be required to established the desired tuning condition.

In practice the circuit of FIG. 3 is tuned to the high frequency resonance condition without any capacitor in the circuit for the discrete element $C_{2'}$. The magnitude required for $C_{2'}$ in order to tune the desired lower frequency resonance may then be computed. This capacitance may be implemented with a suitable discrete capacitor or with an appropriate stack of chip capacitors.

Figure 4A:
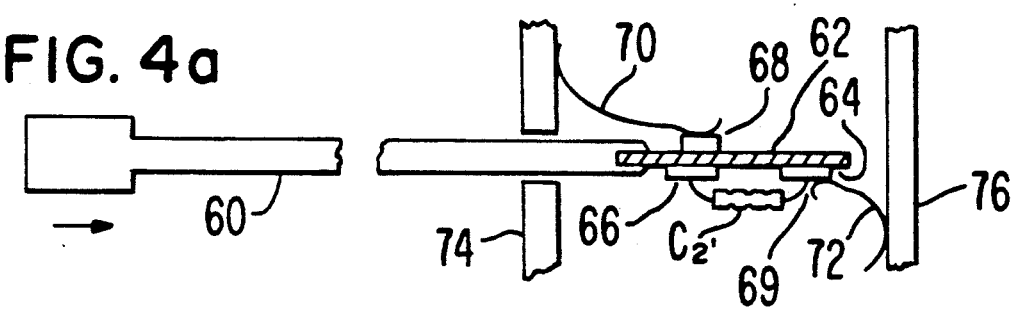
FIGS. 4(a) and 4(b) are tuning wands suitable for incorporation in the present invention.

FIG. 4(a) illustrates one mechanical implementation of a suitable tuning wand for the present invention. Shaft 60 supports substrate 62 upon which there is mounted a capacitance $C_{2'}$ preferably implemented from a number of chip capacitors. Either end of capacitance $C_{2'}$ is secured electrically to respective solder pads 64 and 66 which are affixed to substrate 62. A further contact pad 68 is secured to the reverse side of substrate 62 and electrically connected to capacitor $C_{2'}$ through contact pad 66. Shaft 60 is capable of translation axially by a discrete increment defined by suitable detentes in a slot or linear bearing surface (not shown) for defining the axial motion which is limited by stop (not shown). Spring contacts 70 and 72 engage contact pads 64 and 66 to complete the electrical contacts to other circuit components located on printed circuit boards 74 and 76.

Figure 4B:
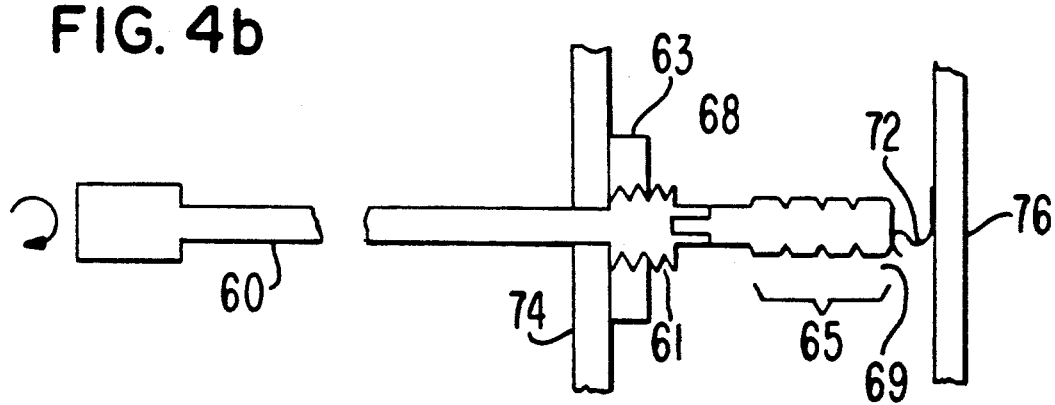

FIG. 4(b) shows a variation of the mechanical implementation of a tuning wand wherein shaft 60 has a threaded portion 61 engaging a threaded block 63 through which electrical contact is made to one end of the capacitor $C_{2'}$ formed of chip capacitors arranged to form stack 65. Axial travel of the shaft is limited by a suitable stop (not shown). Prior to reaching the stop position, the end 69 of the chip capacitor stack contacts a spring 72 to form the remaining electrical contact to circuit components located on printed circuit boards 76 and/or 74.

Several advantages are obtained through the invention apart from the wider tuning range indicated above. For example, the two-pole switch achieves simplicity in fabrication in comparison with the three-pole switch of the prior art. Moreover, reliability is improved through fewer contact surfaces and attendant deleterious effects from corrosive atmosphere or other mechanical deterioration. The protection afforded to the tune and match network by the effective RF voltage division reduces the incidence of over voltage conditions leading to undesired arcing and like transients which may insert artifacts into the data.

Figure 5:
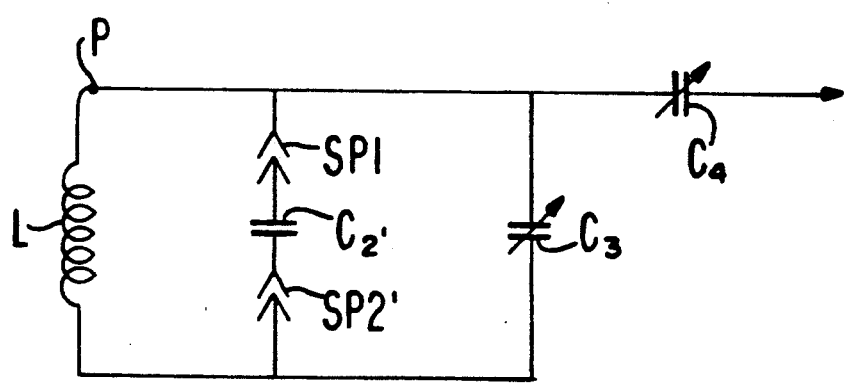
FIG. 5 is a simple probe circuit of prior art.

In respect to the latter point, consider that the capacitor labeled $C_3$ in FIGS. 2, 3 and 5 is typically a 1–10 pf trimmer capacitor having a typical RF voltage rating of about 2 kv (peak-to-peak) as a consequence of its necessarily compact dimensions. Under typical conditions, e.g., about 250 watt (RMS) dissipated in the coil, the point P may experience an RF potential swing of about 8 kv (peak-to-peak). Under such conditions an undesired discharge is likely absent protection of the $C_3$ capacitor.

FIG. 5 is a simple probe coil arrangement lacking the protection of capacitance $C_1$. FIG. 6(b) is the spectral response to a sample of Dioxane for an instrument incorporating the present invention. FIG. 6(a) is the spectral response of the identical instrument to the same sample using the circuit of FIG. 3. Both circuits are tuned to resonance at $\omega_r = 100.6$ MHz. These FIGS. 6(a) and 6(b) are composites of the spectral line responses obtained from each of a sequence of single pulse excitations for which the pulse width is increased in successive excitations. In FIG. 6(a), the signal amplitude as a function pulse width has the expected sinusodal dependence. For the probe of FIG. 3, producing the data of FIG. 6(a), the capacitance values were $C_{2'} = 6$ pF and $C_1 = 20$ pF. For both the circuits of FIG. 3 and of FIG. 5, the latter yielding the spectra of FIG. 6(b), $C_3 = 1-10$ pF and $C_4 = 1-10$ pF. $C_{2'}$ is similar for the two circuits. A pulse width of about 5 microseconds is observed to yield maximum amplitude corresponding to nutation of the proton spin by 90° by inspection of FIG. 6(a). The additional artifact appearing in FIG. 6(b) spectra is due to the occurence of instrumental transients (due to arcing) generated during excitation.

While the invention has been described in connection with particular exemplary embodiments, it is to be understood that the embodiments are presented by example only and not as a limitation on the scope of the invention.

I claim:

1. An instrument for exciting and detecting nuclear magnetic resonance of selected gyromagnetic resonators comprising:
   (a) Polarizing magnet means for inducing precession of said resonators about a selected axis,
   (b) RF field means for causing said resonators to coherently rotate to a desired orientation with respect to said selected axis, (c) Signal acquisition means for observing a signal derived from the subsequent motion of said resonators, (d) Said RF field means comprising:
  (i) an inductor having inductance L, and a first capacitance in parallel relationship with said inductor forming an LC parallel combination, said first capacitance selectable from at least two values of capacity thereof,
  (ii) a tune and match network for tuning said LC parallel combination and introducing a desired impedance at a terminal of said network.
  (iii) said LC parallel combination communicating with said tune and match network through a coupling capacitor, and
  (v) two-pole switch means for selecting from said at least two values of capacitance for the effective value of said another capacitance.

2. The instrument of claim 1 wherein one of said two values of capacity for said another capacitance is the stray capacitance effecting said RF field means.

3. A high power RF probe circuit comprising:
  (a) an inductor having inductance L,
  (b) a tune and match network for tuning said inductance L and introducing a desired impedance at a terminal of said network,
  (c) a first capacitance in parallel relationship with said inductance L forming an LC parallel combination, said first capacitance selectable from at least two values of capacity thereof,
  (d) said LC parallel combination communicating with said tune and match network through a coupling capacitor, and
  (e) two-pole switch means for selecting from said at least two values of capacitance for the effective value of said first capacitance.

4. The RF probe of claim 3 wherein one of said two values of capacitance is the stray capacitance of said probe circuit.

* * * * *